US008921183B2

(12) United States Patent
Huang et al.

(10) Patent No.: US 8,921,183 B2
(45) Date of Patent: Dec. 30, 2014

(54) METHOD FOR FABRICATING TRENCH ISOLATION STRUCTURE

(75) Inventors: Jen-Jui Huang, Taoyuan County (TW); Hung-Ming Tsai, Kaohsiung (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 12/962,655

(22) Filed: Dec. 8, 2010

(65) Prior Publication Data

US 2012/0149172 A1 Jun. 14, 2012

(51) Int. Cl.
*H01L 21/336* (2006.01)
*H01L 21/76* (2006.01)
*H01L 21/762* (2006.01)

(52) U.S. Cl.
CPC ................................ *H01L 21/76227* (2013.01)
USPC ............ 438/270; 438/425; 438/427; 438/433; 438/435; 438/446; 257/E21.41; 257/E21.54; 257/E21.546; 257/E21.548; 257/E21.555

(58) Field of Classification Search
USPC ....... 257/E21.41, E21.546, E21.54, E21.548, 257/E21.555; 438/270, 425, 427, 433, 435, 438/437, 446
See application file for complete search history.

(56) References Cited

U.S. PATENT DOCUMENTS

| 4,666,556 | A | * | 5/1987 | Fulton et al. | 438/431 |
| 5,455,194 | A | * | 10/1995 | Vasquez et al. | 438/425 |
| 5,472,904 | A | * | 12/1995 | Figura et al. | 438/426 |
| 5,780,346 | A | * | 7/1998 | Arghavani et al. | 438/296 |
| 5,989,977 | A | * | 11/1999 | Wu | 438/431 |
| 2003/0162366 | A1 | * | 8/2003 | Puchner et al. | 438/446 |
| 2007/0243692 | A1 | * | 10/2007 | Rudeck et al. | 438/400 |
| 2007/0290293 | A1 | * | 12/2007 | Trivedi et al. | 257/506 |
| 2007/0290294 | A1 | * | 12/2007 | Smythe et al. | 257/510 |
| 2008/0099823 | A1 | * | 5/2008 | Hong et al. | 257/316 |
| 2008/0194073 | A1 | * | 8/2008 | Park | 438/424 |
| 2008/0242047 | A1 | * | 10/2008 | Shin et al. | 438/438 |
| 2009/0068816 | A1 | * | 3/2009 | Eun | 438/425 |
| 2009/0267176 | A1 | * | 10/2009 | Yang et al. | 257/506 |
| 2010/0035430 | A1 | * | 2/2010 | Andry et al. | 438/667 |
| 2010/0102415 | A1 | * | 4/2010 | Millward et al. | 257/506 |

FOREIGN PATENT DOCUMENTS

CN 101436565 5/2009

OTHER PUBLICATIONS

"Office Action of China Counterpart Application", issued on Nov. 21, 2013, p. 1-p. 6.

* cited by examiner

*Primary Examiner* — Mohsen Ahmadi
(74) *Attorney, Agent, or Firm* — Jianq Chyun IP Office

(57) ABSTRACT

A method for fabricating a trench isolation structure is described. A trench is formed in a substrate. A liner layer is formed at least in the trench. A precursor layer is formed at least on the sidewalls of the trench. The precursor layer is converted to an insulating layer that has a larger volume than the precursor layer and fills up the trench.

5 Claims, 4 Drawing Sheets

METHOD FOR FABRICATING TRENCH ISOLATION STRUCTURE

BACKGROUND OF THE INVENTION

1. Field of Invention

This invention relates to a method for fabricating a trench isolation structure.

2. Description of Related Art

The device isolation structures formed in advanced semiconductor processes are mostly trench structures. A trench structure is conventionally formed by forming a trench in a substrate and then forming an insulating layer filling up the trench by HDP-CVD or the spin-on dielectric (SOD) technique.

However, when the process linewidth is reduced to below 20 nm and the aspect ratio of the trench is larger than 6, a void is easily formed in the insulating layer filled in the trench. Such a void seriously affects the device reliability and the yield, and also hinders the miniaturization of the semiconductor device geometry. For example, a contact later formed over the trench isolation with an opened void in the insulating layer may cause punch-through to the isolated area.

SUMMARY OF THE INVENTION

Accordingly, this invention provides a method for fabricating a trench isolation structure.

The method for fabricating a trench isolation structure is described below. A trench is formed in a substrate. A liner layer is formed at least in the trench. A precursor layer is formed at least on sidewalls of the trench, and is then converted to an insulating layer that has a larger volume than the precursor layer and fills up the trench.

In the above method, the precursor layer may be converted to the insulating layer by oxidation. The liner layer may be formed also over the substrate. The precursor layer may be formed also over the substrate so that the insulating layer therefrom is also over the substrate.

By carefully setting the thickness of the precursor layer according to the width of the trench and the volume expansion ratio of the material of the precursor layer as being converted to the material of the insulating layer, a void-free trench isolation structure can be obtained. In addition, the liner layer is intended to prevent the portion of the substrate around the trench from being affected in the step of converting the precursor layer to the insulating layer, and therefore should be thick enough.

In order to make the aforementioned and other objects, features and advantages of this invention comprehensible, a preferred embodiment accompanied with figures is described in detail below.

DESCRIPTION OF EMBODIMENTS

This invention is further explained with the following embodiment and the accompanying drawings, which are not intended to limit the scope of this invention.

FIGS. 1A-1G illustrate, in a cross-sectional view, a method for fabricating a trench isolation structure according to an embodiment of this invention.

Figure 1A:
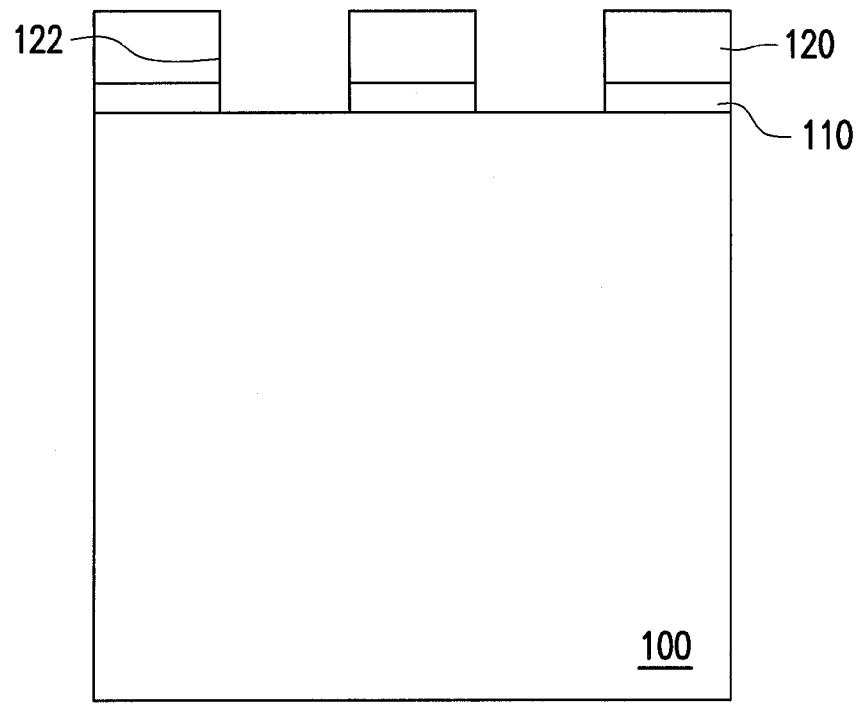
FIGS. 1A-1G illustrate, in a cross-sectional view, a method for fabricating a trench isolation structure according to an embodiment of this invention, wherein FIG. 1G also illustrates a trench isolation structure according to the embodiment.

Referring to FIG. 1A, a semiconductor substrate 100 is provided, which may be a single-crystal silicon substrate or an epitaxial silicon substrate. A patterned hard mask layer 120 is then formed over the substrate 100, having therein a trench pattern 122 for defining the trench of the trench isolation structure. The patterned hard mask layer 120 may include silicon nitride (SiN), and can be defined by a correspondingly patterned photoresist film (not shown). When the patterned hard mask layer 120 includes SiN, a pad oxide layer 110 may be formed over the substrate 100 before the hard mask layer 120 is formed and patterned after the hard mask layer 120 is patterned. The critical dimension of the trench pattern 122 may be less than 20 nm.

Figure 1B:
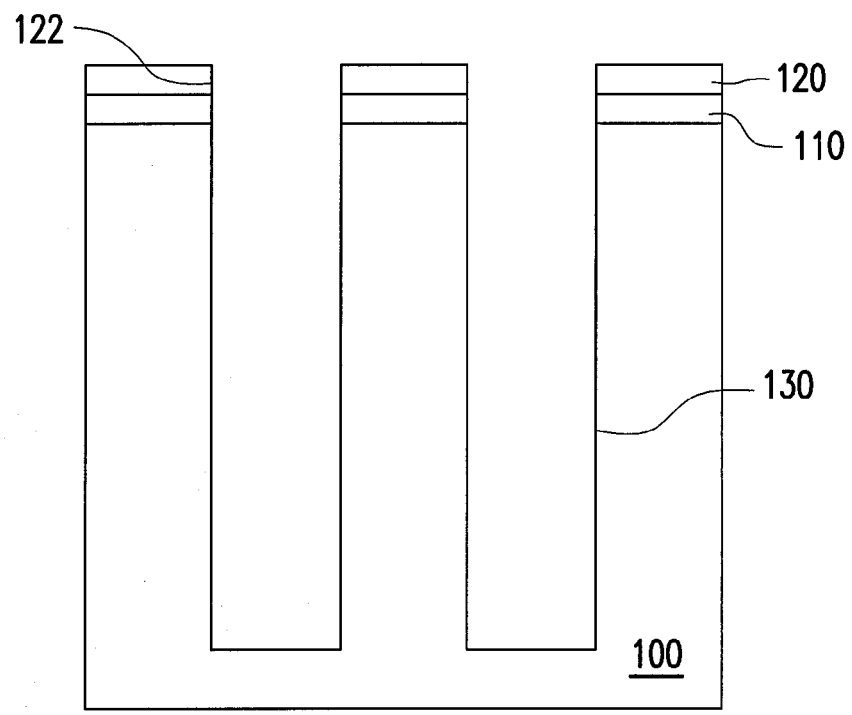

Referring to FIG. 1B, the substrate 100 is then anisotropically etched using the patterned hard mask layer 120 as an etching mask to transfer the trench pattern 122 to the substrate 100, i.e., to form a trench 130 of the trench isolation structure in the substrate 100. The depth of the trench 130 may range from 150 nm to 250 nm, and the width of the same may range from 10 nm to 40 nm. When the width of the trench 130 is 40 nm, for example, the aspect ratio of the same is usually set at about 4-6. When the width is 25 nm, for example, the aspect ratio is usually set at about 6. When the width is further reduced to below 20 nm, the aspect ratio is larger than 6, and the trench filling becomes difficult in the prior art and requires the method of this invention as a solution. It is also noted that the patterned hard mask layer 120 has much loss during the etching process because the depth of the trench 130 is relatively large.

Figure 1C:
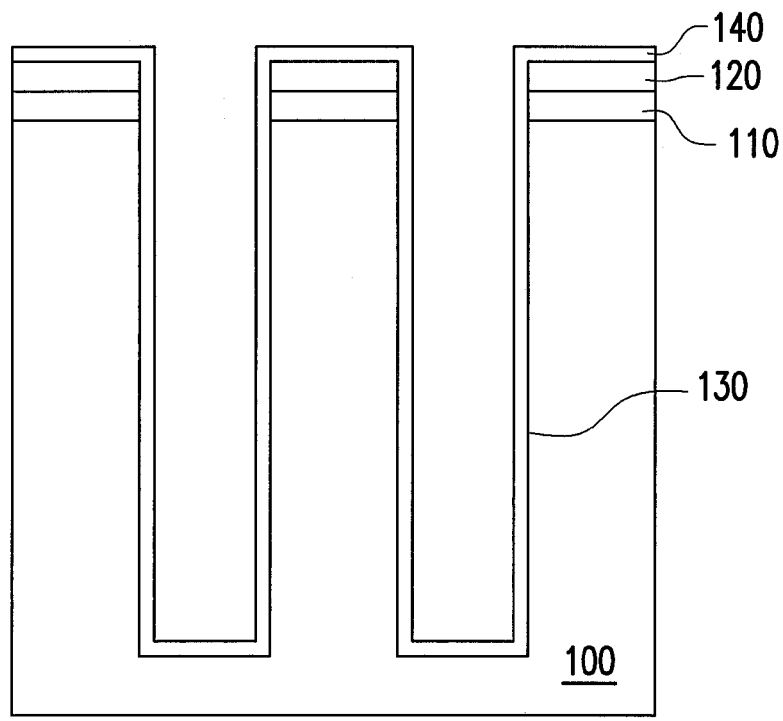

Referring to FIG. 1C, a liner layer 140 is formed in the trench 130 and on the patterned hard mask layer 120 over the substrate 100. The liner layer 140 is capable of preventing the portions of the substrate 100 around the trench 130 from being affected during the process of converting the precursor layer filled in the trench 130 later to an insulating layer, and therefore should be thick enough. For example, in a case where the precursor layer is to be converted to an insulating layer through oxidation, the liner layer 140 is thick enough to block oxygen gas and prevent oxidation of the portions of the substrate 100 around the trench 130 in the oxidation step. The liner layer 140 may include SiN, and may have a thickness of 15-50 angstroms to be effective in blocking oxygen gas as the converting method is oxidation. When the liner layer 140 includes SiN, it can be formed with low-pressure chemical vapor deposition (LPCVD) or atomic layer deposition (ALD).

Figure 1D:
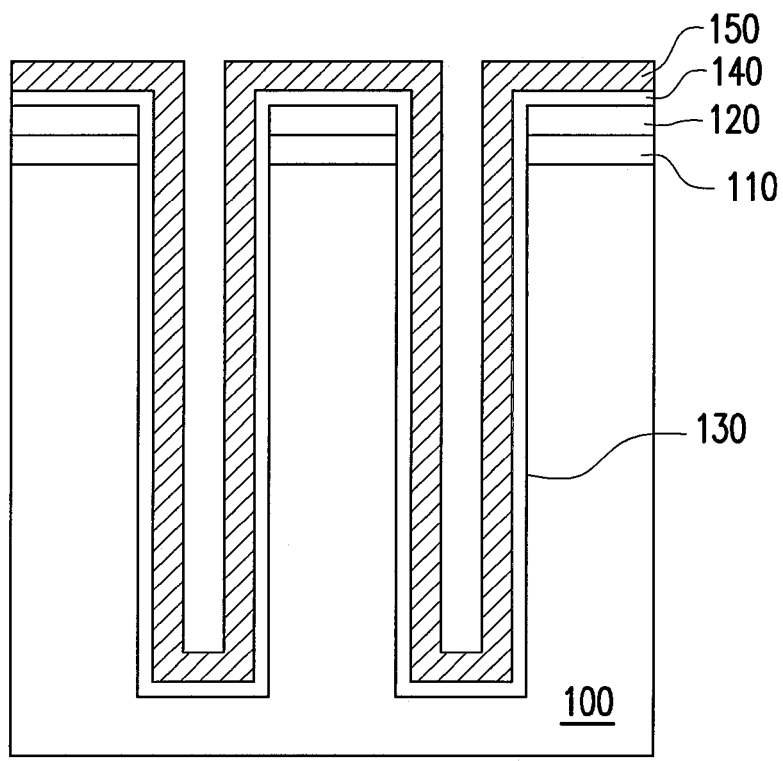

Referring to FIG. 1D, a precursor layer 150 to be converted to an insulating layer is formed on the bottom and the sidewalls of the trench 130 and also over the patterned hard mask layer 120 over the substrate 100. The precursor layer 150 may include a silicon material, such as undoped poly-Si, doped poly-Si or amorphous silicon, and can be formed by CVD. For example, when the precursor layer 150 includes undoped poly-Si, it can be formed through LPCVD using $SiH_4$ as a reaction gas in a furnace.

Figure 1E:
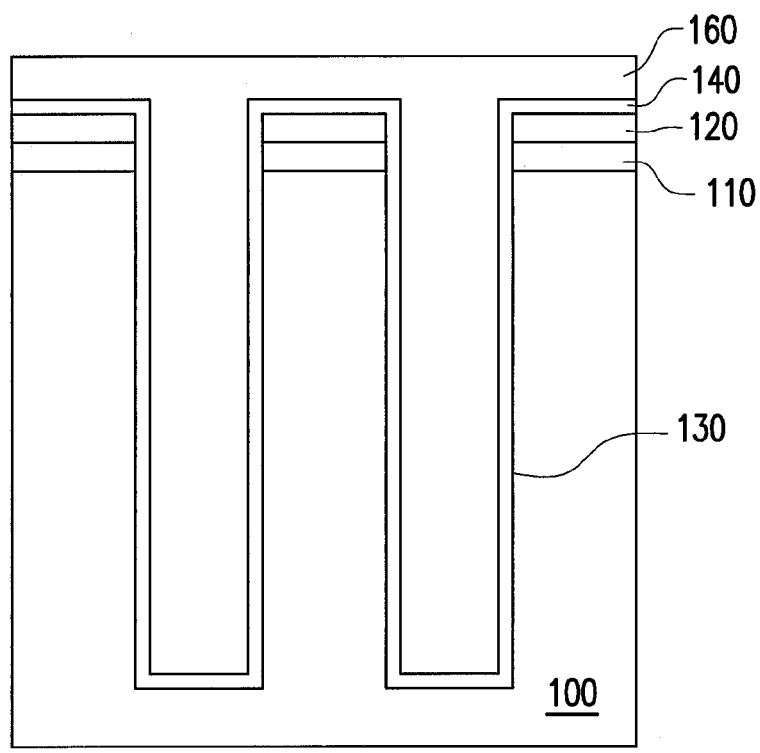

Referring to FIG. 1E, the precursor layer 150 is converted to an insulating layer 160 that has a larger volume than the precursor layer 150 and fills up the trench 130, possibly through oxidation. The oxidation can be done through a furnace oxidation step, at a temperature depending on the material of the precursor layer 150. When the precursor layer 150 is converted to the insulating layer 160 by oxidation, the insulating layer 160 includes the corresponding oxide of the material of the precursor layer 150. For example, when the precursor layer 150 includes a silicon material and is converted to the insulating layer 160 through oxidation, the insulating layer 160 includes $SiO_2$.

In addition, for example, when the precursor layer 150 includes poly-Si and is to be converted to the insulating layer 160 through a furnace oxidation step, the furnace oxidation step can be done at 850-950° C., for a period of time depending on the thickness of the precursor layer 150.

In the above process illustrated in FIGS. 1D-1E, the thickness of the precursor layer 150 is set according to the width of the trench 130 and the volume expansion ratio of the material of the precursor layer 150 as being converted to the material of the insulating layer 160, such that the trench 130 is filled up by the resulting insulating layer 160 without a void formed therein.

More specifically, when the width of the trench 130 is "a" and the material of the precursor layer 150 has a volume expansion ratio "b" as being converted to the material of the insulating layer 160, the thickness of the precursor layer 150 is set to (a/2)/b at least. For example, poly-Si has a volume expansion ratio of about 2.0 (b=2) as being oxidized into silicon dioxide. If the width of the trench 130 is 40 nm and the precursor layer 150 includes poly-Si and is to be converted to an insulating layer 160 including $SiO_2$, the thickness of the precursor layer 150 is set to 10 [=(40/2)/2] nm at least, possibly 10-18 nm.

Figure 1F:
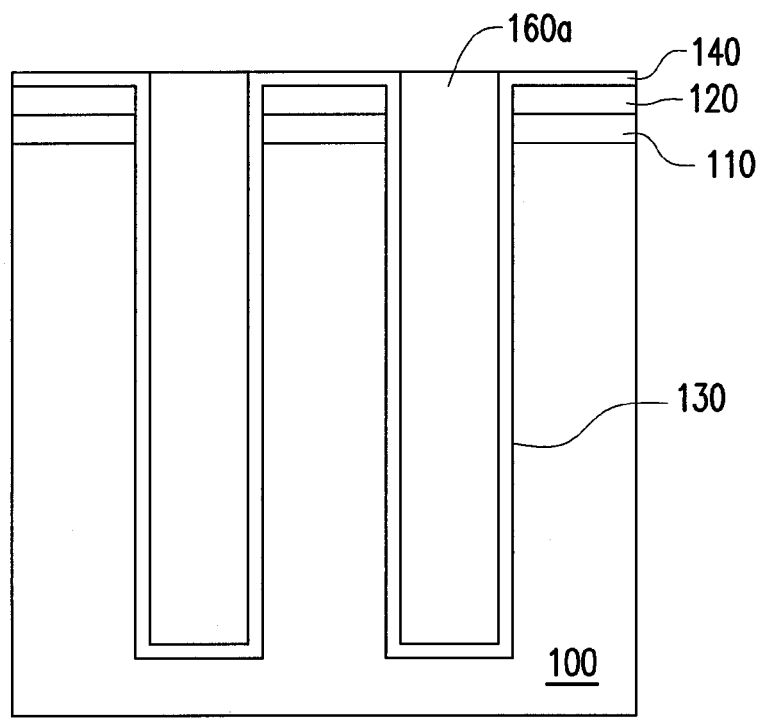

Referring to FIG. 1F, after the insulating layer 160 filling up the trench 130 is formed, the portions of the insulating layer 160 outside of the trench 130 are removed, possibly by chemical mechanical polishing (CMP). The slurry for the CMP process of the insulating layer 160 is usually based on silica and/or alumina particles. The remaining portions of the insulating layer 160 are indicated by "160a".

Figure 1G:
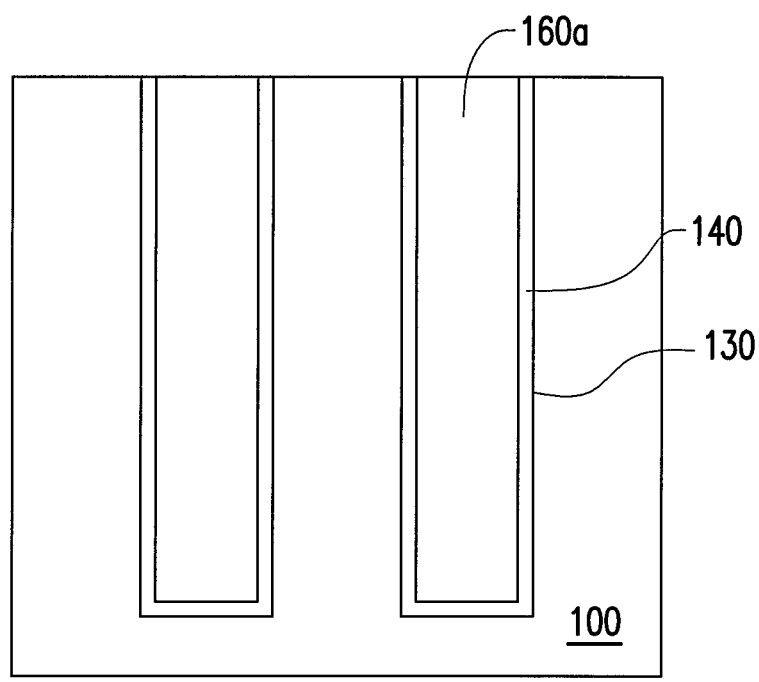

Referring to FIG. 1G, thereafter, the portions of the liner layer 140 outside of the trench 130, the patterned hard mask layer 120 on the pad oxide layer 110 and the pad oxide layer 110 are removed, possibly by wet etching, while portions of the insulating layer 160a are also removed. For example, when the liner layer 140 and the hard mask layer 120 include silicon nitride, they can be wet-etched using phosphoric acid. The pad oxide layer 110 can be wet-etched using hydrofluoric acid (HF).

FIG. 1G also illustrates a trench isolation structure according to the embodiment. The trench isolation structure includes: a substrate 100 having therein a trench 130 that has a width below 20 nm and an aspect ratio larger than 6 (not exactly shown in the figure, but should be easy to understand), a liner layer 140 in the trench, and an insulating layer 160a filling up the trench, without a void therein. The depth of the trench 130 and the materials of the liner layer 140 and the insulating layer 160a have been exemplified above.

Since a void-free trench isolation structure can be obtained in this invention, the device reliability and the yield are not adversely affected, and the miniaturization of the semiconductor device geometry is not hindered.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for fabricating a trench isolation structure, comprising:

forming, on a substrate, a pad oxide layer, and a patterned hard mask layer disposed on the pad oxide layer and having therein a pattern of a trench;

forming the trench in the substrate using the patterned hard mask layer as a mask, wherein the trench has an aspect ratio larger than 6;

forming a liner layer in the trench and on the patterned hard mask layer over the substrate; then forming, in presence of the patterned hard mask layer, a silicon layer on sidewalls and a bottom of the trench and also over the patterned hard mask layer, wherein the silicon layer does not fill up the trench; then converting only the silicon layer to an insulating layer that has a larger volume than the layer and completely fills up the trench without a void, by oxidizing the silicon layer using a furnace oxidation step, wherein the liner layer is capable of preventing portions of the substrate around the trench from being affected by the oxidation; then removing portions of the insulating layer over the substrate by CMP; and removing portions of the liner layer outside of the trench, the patterned hard mask layer on the pad oxide layer and the pad oxide layer by wet etching, while portions of the insulating layer are also removed.

2. The method of claim 1, wherein forming the trench comprises: etching the substrate using the patterned hard mask layer as the mask.

3. The method of claim 2, wherein the patterned hard mask layer comprises silicon nitride.

4. The method of claim 1, wherein the liner layer comprises silicon nitride.

5. The method of claim 1, wherein the silicon layer comprises undoped polysilicon, doped polysilicon, or amorphous silicon.

\* \* \* \* \*